(12) United States Patent
Artman et al.

(10) Patent No.: US 11,675,725 B2
(45) Date of Patent: Jun. 13, 2023

(54) INTERPOSER FOR A CPU SOCKET TO PROVIDE A SERIAL COMPUTER EXPANSION BUS CONNECTION

(71) Applicant: Lenovo Global Technology (United States) Inc., Morrisville, NC (US)

(72) Inventors: Paul T. Artman, Cary, NC (US); Martin W Hiegl, Herrenberg (DE); Andrew Junkins, Cary, NC (US)

( * ) Notice: Subject to any disclaimer, the term of this patent is extended or adjusted under 35 U.S.C. 154(b) by 0 days.

(21) Appl. No.: 17/489,614

(22) Filed: Sep. 29, 2021

(65) Prior Publication Data

US 2023/0116097 A1    Apr. 13, 2023

(51) Int. Cl.
| | |
|---|---|
| *G06F 13/40* | (2006.01) |
| *G06F 13/42* | (2006.01) |
| *H01R 12/79* | (2011.01) |
| *H01R 12/77* | (2011.01) |
| *H01R 12/71* | (2011.01) |
| *H05K 7/20* | (2006.01) |
| *H01R 12/70* | (2011.01) |

(52) U.S. Cl.
CPC ......... *G06F 13/4068* (2013.01); *G06F 13/4282* (2013.01); *H01R 12/79* (2013.01); *H01R 12/714* (2013.01); *H01R 12/774* (2013.01); *H05K 7/20509* (2013.01); *G06F 2213/0026* (2013.01); *H01R 12/7047* (2013.01); *H01R 12/7058* (2013.01)

(58) Field of Classification Search
CPC ... G06F 13/4068; G06F 13/4282; H01R 12/714; H01R 12/774; H01R 12/79; H05K 7/20509; G06F 2213/0026; H01R 12/7047; H01R 12/7058
See application file for complete search history.

(56) References Cited

U.S. PATENT DOCUMENTS

| | | | | |
|---|---|---|---|---|
| 9,265,170 | B2* | 2/2016 | Swaminathan et al. | H01R 12/00 |
| 11,269,803 | B1* | 3/2022 | Chou et al. ......... | G06F 13/4045 |
| 2012/0140421 | A1* | 6/2012 | Kirstine ............. | H05K 7/20509 |
| | | | | 361/722 |
| 2014/0089609 | A1* | 3/2014 | Kegel et al. ........ | H01L 25/0652 |
| | | | | 711/E12.001 |
| 2016/0183374 | A1* | 6/2016 | Prakash et al. ...... | H01L 23/498 |
| | | | | 361/767 |
| 2020/0133907 | A1* | 4/2020 | Stuewe et al. ...... | G06F 13/4282 |
| 2020/0303291 | A1* | 9/2020 | Perez-Corona et al. .... | H01L 23/49816 |

* cited by examiner

*Primary Examiner* — Henry Tsai
*Assistant Examiner* — Harry Z Wang
(74) *Attorney, Agent, or Firm* — Jeffrey Streets; Streets Lawfirm

(57) ABSTRACT

An interposer includes a planar substrate and a pad array formed on a bottom side of the planar substrate to connect with a pin array within a CPU socket. A serial computer expansion bus connector is formed on the top side of the planar substrate and is electronically coupled to a portion of the pad array. The interposer further includes a perimeter structure adapted for securing to a CPU carrier. The interposer may be included in a kit with a heatsink securable to the CPU socket, wherein the heatsink includes a contact area for contacting the interposer and applying a load to the interposer. A printed circuit board assembly may include first and second CPU sockets that are connected by a CPU interconnect, where the interposer may be installed in the first CPU socket and a CPU may be installed in the second CPU socket.

20 Claims, 7 Drawing Sheets

INTERPOSER FOR A CPU SOCKET TO PROVIDE A SERIAL COMPUTER EXPANSION BUS CONNECTION

BACKGROUND

The present disclosure relates to an interposer for a CPU socket of a printed circuit board assembly having multiple CPU sockets connected by a CPU interconnect.

Background of the Related Art

In recent years, computer systems have seen a steady increase in the size of CPU sockets, the number of CPU cores, the CPU thermal design point, the number of Peripheral Component Interconnect Express (PCIe) lanes on each CPU socket, and the number of memory channels. These increases and other changes pose a challenge for designing a computer system that can accommodate greater connectivity and features. This challenge is even greater for dense server designs where memory, connectivity, processing and interconnect make it increasingly difficult to route all of the signals. Unfortunately, physical constraints may result in stranding lanes and a reduction in features and performance.

As one example, a computer system may have two CPU sockets and a total of x128 lanes available to be routed as either fixed CPU interconnect lanes or fixed PCIe lanes. However, if the computer system is designed with x64 lanes dedicated to the CPU interconnect, then there are only x64 lanes remaining available to support PCIe connections. In one situation, all x64 lanes might be used to connect a graphics processing unit (GPU), but then there are no remaining available lanes for a high-performance network card. In another situation, x16 lanes may be used to connect each of two high-performance network cards, but this leaves only x32 lanes for connecting a GPU. Regardless of the selected configuration of lanes laid out on the printed circuit board, there are challenges in finding an available location for all the necessary connections.

BRIEF SUMMARY

Some embodiments provide an interposer comprising a planar substrate having a bottom side and a top side. A pad array is formed on the bottom side of the planar substrate, wherein the pad array is configured to connect with a pin array within a first CPU socket. A first serial computer expansion bus connector is formed on the top side of the planar substrate and is electronically coupled to a first portion of the pad array, and a second serial computer expansion bus connector is formed on the top side of the planar substrate and is electronically coupled to a second portion of the pad array. The interposer further comprises a perimeter structure secured to the planar substrate and adapted for securing to a CPU carrier.

Some embodiments provide a kit comprising the disclosed interposer and a heatsink securable to the first CPU socket, wherein the heatsink includes a bottom surface having a contact area for contacting the interposer, wherein the contact area applies a load to the interposer and conducts heat away from the interposer.

Some embodiments provide an apparatus comprising a printed circuit board assembly that includes a first CPU socket and a second CPU socket, wherein the first and second CPU sockets are connected by a CPU interconnect. The disclosed interposer is installed in the first CPU socket, and a CPU is installed in the second CPU socket. A first serial computer expansion bus cable has a first cable connector coupled to the first serial computer expansion bus connector on the interposer, and a second serial computer expansion bus cable has a second cable connector coupled to the second serial computer expansion bus connector on the interposer.

DETAILED DESCRIPTION

Figure 1:
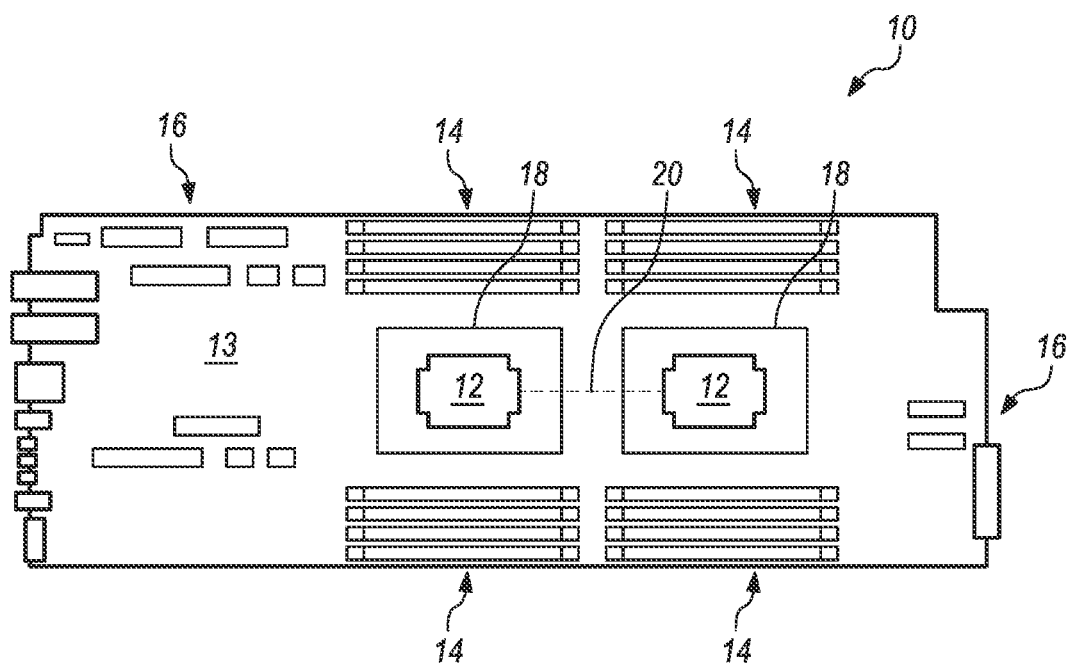
FIG. 1 is a diagram of a motherboard with two central processing units.

Some embodiments provide an interposer comprising a planar substrate having a bottom side and a top side. A pad array is formed on the bottom side of the planar substrate, wherein the pad array is configured to connect with a pin array within a first CPU socket. A first serial computer expansion bus connector is formed on the top side of the planar substrate and is electronically coupled to a first portion of the pad array, and a second serial computer expansion bus connector is formed on the top side of the planar substrate and is electronically coupled to a second portion of the pad array. The interposer further comprises a perimeter structure secured to the planar substrate and adapted for securing to a CPU carrier.

The planar substrate may be a printed circuit board, which may be made using materials, techniques and conditions known for making printed circuit boards for use in other computer and electronic components and devices. For example, the planar substrate may include a dielectric or electrically insulating material, such as a thermoset resin, that also provides mechanical support for electrical conductors and electronic components. Furthermore, the planar substrate may have a laminate structure with conductive traces and conductive layers formed between layers of the dielectric or electrically insulating material. The planar substrate may further include plated through-holes and other structures extending through one or more of the laminate layers in order to establish a desired circuit and/or electrical connection.

Embodiments of the interposer may route a plurality of individual conductors through the planar substrate. Specifically, an individual conductor may connect an individual pad of the pad array formed on the bottom side of the planar substrate to an individual pin, pad or other conductor of the first or second serial computer expansion bus connectors that are formed on the top side of the planar substrate. Other components may be formed on or in the planar substrate or secured to the planar substrate.

Some embodiments of the interposer may include a first retimer electronically coupled between the first portion of the pad array and the first serial computer expansion bus connector, and a second retimer electronically coupled between the second portion of the pad array and the second serial computer expansion bus connector. The retimers may be necessary or helpful to reduce errors in the communication caused by the interconnect, printed circuit board and cabling changes, and signal reflections. Each retimer may be in the form of an integrated circuit chip secured to the planar substrate. Each retimer may receive incoming signals from the serial computer expansion bus, either via the pad array or the serial computer expansion bus connector, and re-generate output signals. Accordingly, each retimer may divide a communication link between two endpoints into completely independent physical segments on each side of the retimer so that any discontinuities in the signals are not cumulative. The serial computer expansion bus may be designed and controlled in accordance with the Peripheral Component Interconnect Express (PCIe) standard or protocol, or other serial computer expansion bus standard or protocol.

In some embodiments, the first and second retimers may be disposed on the top side of the planar substrate. Optionally, the first and second retimers may be placed in a location between the first and second serial computer expansion bus connectors in order to be co-located for thermal communication with a heatsink and/or to avoid physically interfering with routing of a serial computer expansion bus cable.

Some embodiments of the interposer may be characterized by having a form factor allowing for substitution of the interposer for a CPU adapted for use in the first CPU socket. In other words, the form factor of the interposer and a CPU are sufficiently similar that either of the interposer or the CPU may be installed in the particular CPU socket at any particular time. Accordingly, a CPU may be removed and replaced with the interposer and/or the interposer may be removed and replaced with the CPU. For example, a carrier frame may be secured to either the CPU or the interposer prior to installation in the CPU socket. In this manner, the interposer provides a configuration option that was not previously available. A printed circuit board assembly having first and second CPU sockets may receive first and second CPUs and be operated as a dual CPU computing system. Alternatively, that same printed circuit board having the same first and second CPU sockets may receive the interposer in the first CPU socket and a CPU in the second CPU socket, such that the interposer provides at least one serial computer expansion bus connection to at least one expansion card. In this later alternative, the CPU installed in the second CPU socket may communicate with the at least one expansion card via the CPU interconnect, the interposer and at least one serial computer expansion bus cable. Nonlimiting examples of the expansion card include a graphics processing unit (GPU), network adapter, non-volatile memory, and the like.

In some embodiments, the interposer has a perimeter structure that includes a lid. Accordingly, the lid may have a substantially role in the form factor of the interposer. For example, the perimeter dimensions, shape, features and/or contours of the lid may or may not provide the interposer with a sufficiently similar form factor as a CPU to be interchangeable with a CPU carrier and/or the CPU socket itself. In one option, the lid of the interposer may facilitate the interposer being secureable to a CPU carrier in the same manner as a CPU is securable to the CPU carrier.

Some embodiments provide a kit comprising the disclosed interposer and a heatsink securable to the first CPU socket, wherein the heatsink includes a bottom surface having a contact area for contacting the interposer, wherein the contact area applies a load to the interposer and conducts heat away from the interposer. The amount of load (force) applied to the interposer may be important to establish a reliable connection between the individual pads of the pad array and the individual pins or other conductors of the pin array of the CPU socket. Preferably, the total amount of load (force) applied to the interposer from all sources, such as the load frame and the heatsink, is the same amount of load (force) applied to a CPU for use in the same or similar CPU socket. However, if fewer than all of the individual pads of the pad array are to be used to form connections to the first and second serial computer expansion bus connectors, then a reduced total load may be applied so that the amount of load per pad remains about the same. For embodiments where the bottom of the heatsink does not make uniform contact with the top surface of the interposer, such as the lid, the heatsink may include stiffening ribs disposed on the top surface and may extend along opposing sides of the top surface so that the heatsink load is more evenly applied across the top of the interposer.

In some embodiments, the kit may provide some or all of the components necessary to recover CPU interconnect lanes for use as one or more serial computer expansion bus connections with expansion cards or components, such as a GPU, network adapter and/or nonvolatile memory. However, a kit may include some of the necessary components, while other necessary component may be independently obtained by a system user, designer, installer or manufacturer. For example, the serial computer expansion bus cables may be a standard item available through other channels, such that the kits may include the interposer and the heatsink that accommodate the use of standard serial computer expansion bus cables with the interposer.

In some embodiments of the kit, the interposer may include any of the interposer embodiments described herein. For example, the kit may include an interposer that includes a first retimer and a second retimer, where the first retimer is electronically coupled between the first portion of the pad array and the first serial computer expansion bus connector, and the second retimer is electronically coupled between the second portion of the pad array and the second serial computer expansion bus connector. Furthermore, the first and second retimers may be disposed on the top side of the planar substrate and may be located between the first and second serial computer expansion bus connectors, and wherein the heatsink includes a set of heatsink fins disposed on a top surface of the heatsink for alignment with the first and second retimers.

Some embodiments of the kit may further include at least one serial computer expansion bus cable having a cable connector for connecting to a serial computer expansion bus connector on the interposer. In some embodiments, the kit may include a first serial computer expansion bus cable having a first cable connector for connecting to the first serial computer expansion bus connector on the interposer and a second serial computer expansion bus cable having a second cable connector for connecting to the second serial computer expansion bus connector on the interposer. Accordingly, the heatsink may include a first passage for the first serial computer expansion bus cable to extend away from the first serial computer expansion bus connector on the interposer and a second passage for the second serial computer expansion bus cable to extend away from the second serial computer expansion bus connector on the interposer. In one option, the first passage extends laterally along the bottom surface of the heatsink to a first edge of the heatsink and the second passage extends laterally along the bottom surface of the heatsink to a second edge of the heatsink that is opposite of the first edge. Accordingly, with this option, the first and second cable connectors on the ends of the serial computer expansion bus cables may be 90-degree connectors having a low profile. In another option, the first passage extends though the heatsink from the bottom surface to the top surface of the heatsink for alignment with the first serial computer expansion bus connector on the interposer and the second passage extends through the heatsink from the bottom surface to the top surface of the heatsink for alignment with the second serial computer expansion bus connector on the interposer. Accordingly, with this latter option, the first and second cable connectors on the ends of the serial computer expansion bus cables may be 180-degree connectors.

Some embodiments provide an apparatus comprising a printed circuit board assembly that includes a first CPU socket and a second CPU socket, wherein the first and second CPU sockets are connected by a CPU interconnect. The disclosed interposer is installed in the first CPU socket, and a CPU is installed in the second CPU socket. A first serial computer expansion bus cable has a first cable connector coupled to the first serial computer expansion bus connector on the interposer, and a second serial computer expansion bus cable has a second cable connector coupled to the second serial computer expansion bus connector on the interposer.

In some embodiments of the apparatus, the interposer that is installed in the first CPU socket may include any of the interposer embodiments described herein. In addition, some of the apparatus embodiments may include any of the kit embodiments or kit components embodiments described herein.

Some embodiments of the apparatus further include a heatsink secured to the first CPU socket, wherein the heatsink includes a bottom surface having a contact area in contact with the interposer. The contact area may apply a load to the interposer and conduct heat away from the interposer. The heatsink may further include at least one passage that enables at least one serial computer expansion bus cable to extend away from at least one serial computer expansion bus connector on the interposer. For example, the heatsink may include a first passage for the first serial computer expansion bus cable to extend away from the first serial computer expansion bus connector on the interposer and a second passage for the second serial computer expansion bus cable to extend away from the second serial computer expansion bus connector on the interposer.

Some embodiments of the apparatus may further include an expansion card or other component selected from a graphics processing unit, a network adapter and/or a nonvolatile memory device, wherein the selected component(s) is/are connected to the interposer via a serial computer expansion bus cable. A flexible cable may be used to connect to the expansion card or other component in various locations on the printed circuit board assembly and/or at various distances from the interposer.

Some embodiments of the interposer, kit and/or apparatus provide the technical benefit of providing additional flexibility in the configuration of a computing system that has at least two CPU sockets connected by a CPU interconnect. Specifically, a computing system, such as a server, may have a substantial number of serial communication lanes dedicated to a CPU interconnect between dual CPU sockets to support the operation of dual CPUs, yet the computing system may be configured with an interposer installed in one of the CPU sockets so that those dedicated lanes may be recovered or reused for serial computer expansion bus connections, such as PCIe connections, to other expansion cards or devices as needed. In some cases, workloads may have been optimized for execution by a graphics processing unit (GPU) and, as a result, may not require or utilize two CPUs. Especially with CPU cores increasing rapidly in recent years, the performance of a single CPU with multiple cores working with a GPU may be more than sufficient to provide the best application performance. Furthermore, using two CPUs may even have a negative impact on performance since balanced input/output (IO) may be required to offset non-uniform memory access (NUMA) performance issues. Designing a computing system to have balanced IO increases the cost of the system in addition to the second CPU and additional memory.

Embodiments may utilize a common dual CPU socket (2S) server design, but only populate one CPU and recover the signals of the CPU-to-CPU interconnect for serial computer expansion bus lanes, such as PCIe lanes, to be used for other purposes, such as for GPU connectivity. Some embodiments may therefore be used in a first non-accelerated configuration as a traditional 2S system with two CPUs, or may use the interposer to achieve an accelerated configuration (i.e., including a GPU) as a 1S system with one CPU. Accordingly, various embodiments may be beneficially used in artificial intelligence applications, such as in the formation of a neural network. The use of interconnected GPUs with a mesh topology for scale-out is applicable for use with artificial intelligence (AI) using neural networks as well as high-performance computing (HPC). Both HPC and AI applications take advantage of the high parallel nature of GPUs.

Embodiments may also utilize the interposer in a server design having two or more CPU sockets, such that one or more CPU socket may be occupied by an interposer and one or more CPU socket may be occupied by a CPU. For example, a system board having four CPU sockets might have 3 CPUs and 1 interposer, 2 CPUs and 2 interposers, or 1 CPU and 3 interposers. The particular configuration of CPUs and interposers among a set of available CPU sockets may be selected on the basis of the type of workload that is expected to be performed by the system.

FIG. 1 is a diagram of a motherboard or printed circuit board assembly 10 with two central processing units (CPUs) 12. Each CPU 12 is installed in one of the two CPU sockets 18 that are connected by a CPU interconnect 20 (illustrated in dashed lines). Furthermore, each CPU 12 has access to dual in-line memory modules (DIMMs) 14 and various connectors 16 for input/output or expansion cards. A printed circuit board 13 provides physical support for the CPU sockets 18, the connectors for the DIMMs 14, the other various connectors 16, and conductive traces and through holes, such as the CPU interconnect 20, among and between such components using one or more layers on or within the printed circuit board 13.

Figure 2:
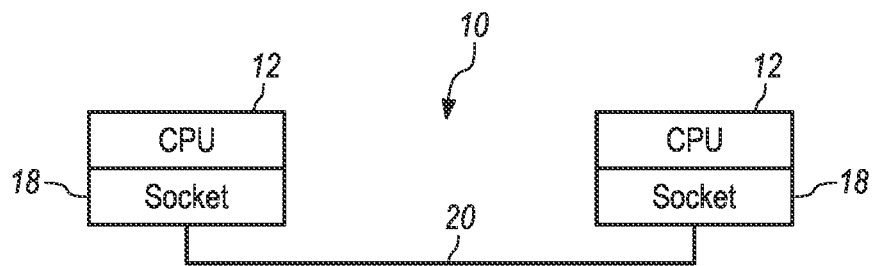
FIG. 2 is a schematic diagram of the motherboard illustrating the two central processing units installed in two sockets having a CPU interconnect therebetween.

FIG. 2 is a schematic diagram of the motherboard or printed circuit board assembly 10 illustrating the two central processing units 12 installed in the two sockets 18 having the CPU interconnect 20 therebetween. This is a first configuration of the assembly 10 as a 2S system with two CPUs 12.

Figure 3:
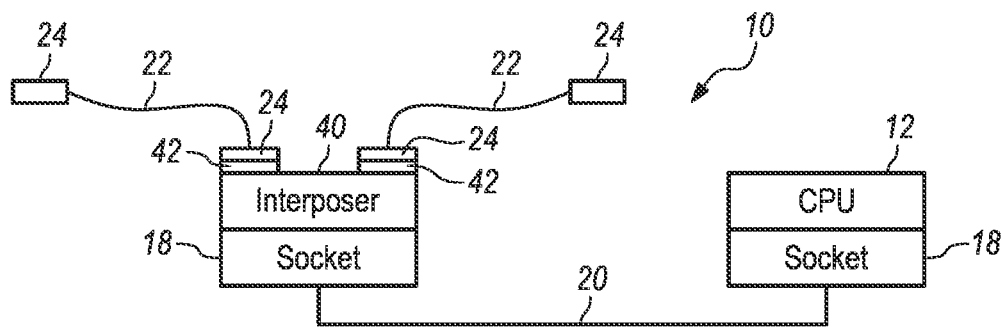
FIG. 3 is a schematic diagram of the motherboard with one of the central processing units removed and replaced with an interposer that is installed in one of the sockets.

FIG. 3 is a schematic diagram of the motherboard or printed circuit board assembly 10 with one of the central processing units 12 (i.e., the left-hand CPU) removed and replaced with an interposer 40 that is installed in one of the sockets 18. The other central processing unit 12 (i.e., the right-hand CPU) remains installed in the other of the two sockets 18. The interposer 40 has a bottom surface exposing a pad array (not shown) that interfaces with the socket 18 and a top surface that includes first and second serial computer expansion bus connectors 42. As shown, a pair of serial computer expansion bus cables 22 each have connectors 24 at opposing ends for forming connections between the first and second serial computer expansion bus connectors 42 and an expansion card or device (not shown). Optionally, one of the serial computer expansion bus cables 22 may connect to a graphics processing unit (GPU) and another of the serial computer expansion bus cables 22 may connect to a network adapter or a nonvolatile memory device. Other configurations may include connections to multiple GPUs and/or other devices. However, the motherboard or printed circuit board assembly 10 may have additional connections, such as PCIe connectors, for connecting with other GPUs, network adapters, nonvolatile memory devices, and the like.

Accordingly, a method may include installing an interposer in a CPU socket of a multisocket server, wherein each socket is connected by a CPU interconnect. The method may further include connecting first and second serial computer expansion bus cables to the interposer, connecting a first expansion card, such as a graphic processing unit, to the first serial computer expansion bus cable, and connecting a second expansion card, such as a network adapter and/or a nonvolatile memory device, to the second serial computer expansion bus cable. Using this method, the signals for a CPU-to-CPU interconnect may be recovered for serial computer expansion bus lanes, such as PCIe lanes, to be used to connect various expansion cards or devices, such as a GPU.

Figure 4:
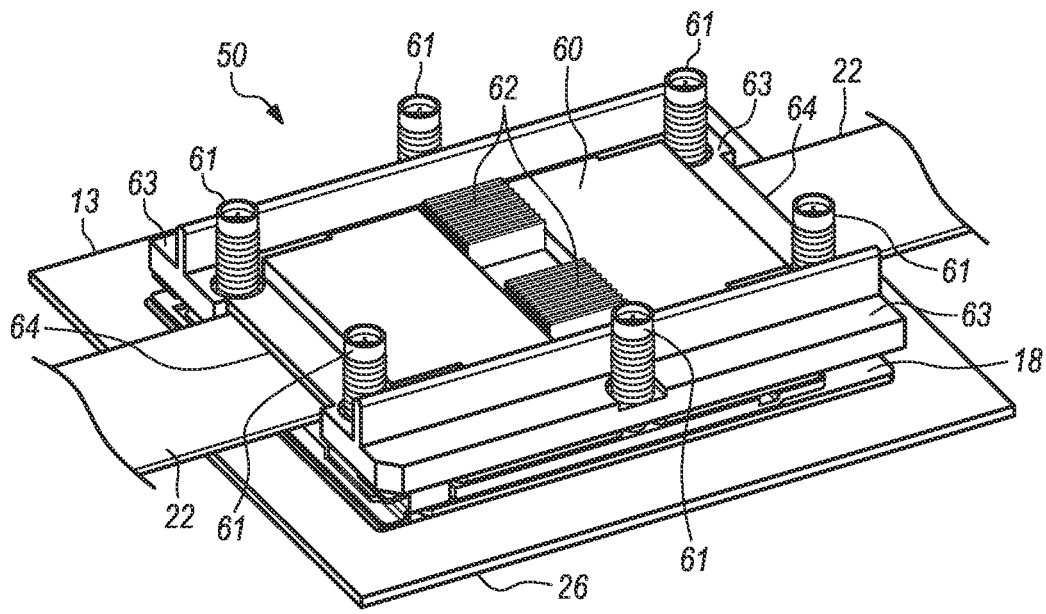
FIG. 4 is a perspective view of a fully assembled system with the interposer, PCIe cable connectors, and heatsink assembly connected to the socket.

FIG. 4 is a perspective view of a fully assembled subsystem 50 with the interposer 40 (not shown; but see FIG. 5) connected to the CPU socket 18 on the printed circuit board 13, PCIe cables 22 connected to the interposer, and a heatsink assembly 60 secured to the socket 18 over the interposer. In FIG. 4, it is possible to see an edge of a CPU tray 26 that receives a carrier frame 28 (not shown; but see FIGS. 7A and 7B). As shown, the heatsink assembly 60 includes a thermally conductive body 63, six (6) spring-loaded mounting screws 61, two sets of heatsink fins 62, and opposing passages 64 that allow the cables 22 to extend laterally from the subsystem 50.

Figure 5:
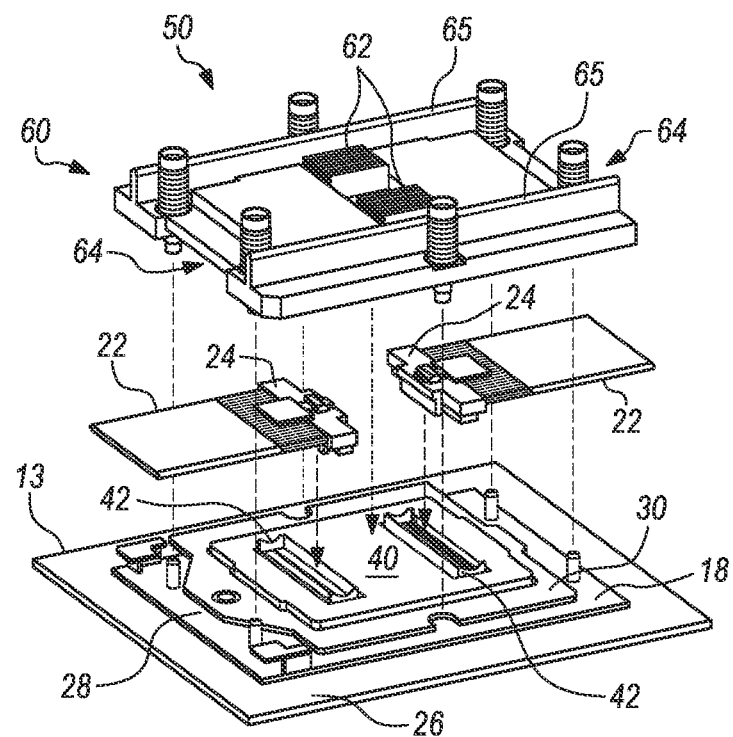
FIG. 5 is a perspective assembly view of a pair of PCIe cable connectors that may be connected to the interposer and a heatsink assembly that may be secured to the socket without interfering with the cable connectors.

FIG. 5 is a perspective assembly view of the subsystem 50. The printed circuit board 13 is shown supporting the CPU socket 18 and the interposer 40 is already secured in the CPU socket 18. Accordingly, a perimeter edge of the interposer 40 may be secured to a carrier frame 28 (only one edge shown; see also FIGS. 7A and 7B), which carrier frame 28 is slidably received in the CPU tray 26 before a load frame 30 is secured over the CPU tray 26 and carrier frame 28. The load frame 30 may be responsible for applying a portion of the load necessary for a pad array (not shown) on a bottom surface of the interposer 40 to engage and connect with a pin array in the socket 18. First and second serial computer expansion bus connectors 42 are accessible from the top of the interposer 40.

A pair of serial computer expansion bus cables 22 each have a connector 24 that is aligned (see dashed lines illustrating alignment) to be connected to the first and second serial computer expansion bus connectors 42 on the top of the interposer 40. Note that the connectors 24 form a near 90-degree angle connector, such that the direction of connection between the connectors 24, 42 is substantially vertical (in the illustration) and the cables 22 extend from the connector 24 in a substantially horizontal direction. However, the cables 22 may be flexible such that they may be directed as necessary to an expansion card or other device for connection with the other end of the cable.

The heatsink assembly 60 has six (6) spring-loaded screws 61 aligned with six (6) threaded holes or other fastening elements on the socket 18. Furthermore, the sets of heat sink fins 62 are aligned with a central area of the interposer 40 between the connectors 42. Also note that the heatsink 60 has a pair of stiffening ribs 65 that extend upward and run along opposing sides of the heatsink 60 to help distribute the load of the spring-loaded fasteners 61 and the weight of the heatsink 60 evenly across the bottom of the heatsink and evenly across the top of the interposer 40. The heatsink 60 includes passages 64 that allow the heatsink 60 to be received over the top of the cables 22 and their connectors 24, to engage the interposer 40, and to be secured to the socket 18 with the screws 61 without interfering with or damaging the cables 22 or their connectors 24. The serial computer expansion bus cables 22 may extend from the subassembly 50 to an expansion card or other devices, such as one or more of a graphics processing unit (GPU), networking adapter, or non-volatile memory (NVMe) storage device.

Figure 6A:
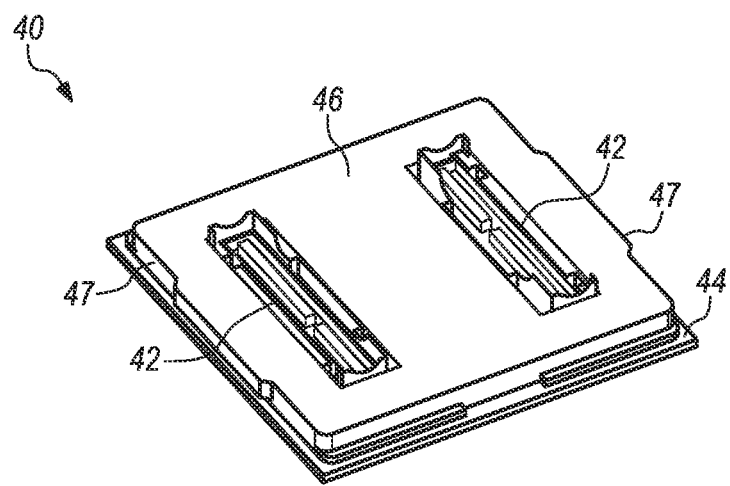
FIG. 6A is a top perspective view of the interposer.

FIG. 6A is a top perspective view of the interposer 40. The interposer 40 includes a planar substrate 44 having a bottom side and a top side. The top side supports the first and second serial computer expansion bus connectors 42 and a lid 46. The connectors 42 may be directed perpendicular to the plane of the planar substrate 44 and accessible through openings in the lid 46. In one example, the connectors 42 are compatible with a serial computer expansion bus, such as the Peripheral Component Interconnect Express (PCIe) standard.

The lid itself may have a perimeter edge 47 having a shape, dimensions and features that, along with the planar substrate 44, give the interposer 40 a sufficiently similar form factor to a CPU so that the interposer 40 is interchangeable with a CPU. For example, the perimeter edge 47 may be configured to be secured to the carrier frame in the same or similar manner as a CPU. Furthermore, the lid 46 has a top surface that is flat for both thermally engaging a heatsink and transferring load (force) from the heatsink to the bottom surface of the interposer 40.

Figure 6B:
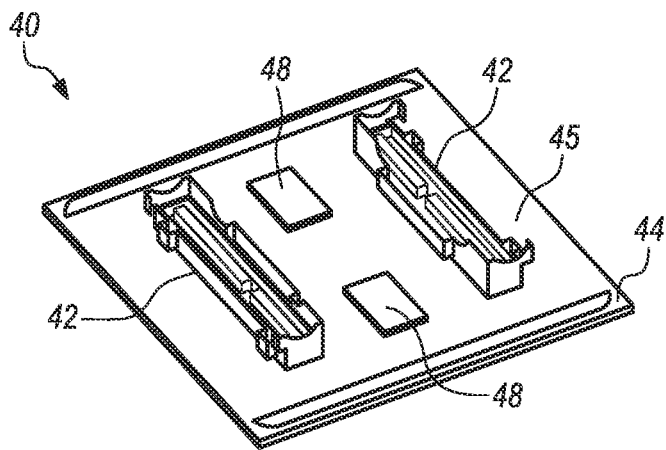
FIG. 6B is a top perspective view of the interposer with its lid removed.

FIG. 6B is a top perspective view of the interposer 40 with its lid 46 removed to reveal the top surface 45 of the planar substrate 44. The top surface 45 supports first and second retimers 48 in an area located between the connectors 42. A first one of the retimers 48 is electronically coupled between a first portion of a pad array (see FIG. 6C) and a first one of the serial computer expansion bus connectors 42. A second one of the retimers 48 is electronically coupled between a second portion of a pad array (see FIG. 6C) and a second one of the serial computer expansion bus connectors 42. Both of the retimers 48 should contact the underside of the lid 46 to enable heat produced by the retimers 48 to be efficiently conducted through the lid 46 to the heatsink 60 (see FIGS. 4 and 5).

Figure 6C:
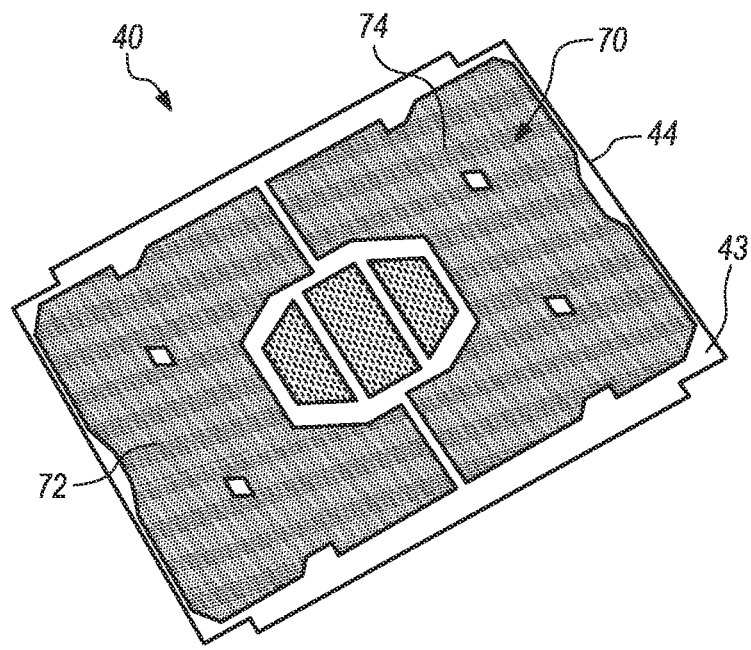
FIG. 6C is a bottom perspective view of the interposer.

FIG. 6C is a bottom perspective view of the interposer 40. The planar substrate 44 of the interposer 40 has a bottom surface 43 and a pad array 70 formed on the bottom surface 43. The pad array 70 is configured to connect with a pin array within a first CPU socket 18. In other words, each individual pad is positioned and sized to engage with one individual pin in the CPU socket 18 and form one electronic connection therebetween. The pad array 70 may include a first portion 72 that is electronically coupled to a first serial computer expansion bus connector 42 formed on the top side or surface of the planar substrate 44 and a second portion 74 that is electronically coupled to a second serial computer expansion bus connector 42 formed on the top side or surface of the planar substrate 44. Although the first and second portions 72, 74 have been illustrated as being physically segregated, embodiments are not limited to any particular arrangement or location of the pads included in the first and second portions.

Figure 6D:
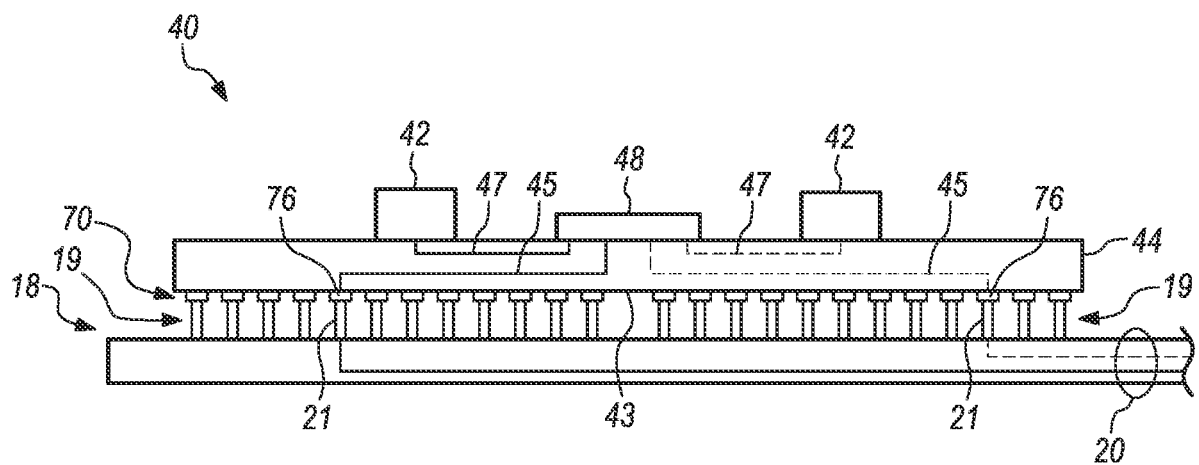
FIG. 6D is a schematic diagram of the interposer illustrating electronic connections between the pad array, the retimers, and the serial computer expansion bus connectors.

FIG. 6D is a schematic diagram of the interposer 40 illustrating an example of an electronic connection between the pad array 70, the retimers 48, and the serial computer expansion bus connectors 42. The socket 18 includes an array of pins 19 that are electronically coupled to the CPU interconnect 20. The pad array 70 of the interposer 40 includes a large number of individual pads 76 that each align with, and engage, an individual pin 21 of the socket 18. An individual pad 76 is electronically connected to one or more conductive elements, such as a conductive trace or through hole, in or on the planar substrate 44. The conductive elements 45 may place the individual pad 76 in communication with one of the retimers 48. Similarly, conductive elements 47 in or on the planar substrate 44 may be used to place the retimer 48 in communication with an individual pin or pad in one of the serial computer expansion bus connectors 42. The dashed lines 45, 47 are intended to illustrate the conductive elements 45 that are routed from certain individual pads in the array 70 to the second retimer (not shown; but see FIG. 6B) that is behind the first retimer 48 and the conductive elements 47 that are routed from the second retimer to the second serial computer expansion bus connectors 42 (located to the right in FIG. 6D).

Figure 7A:
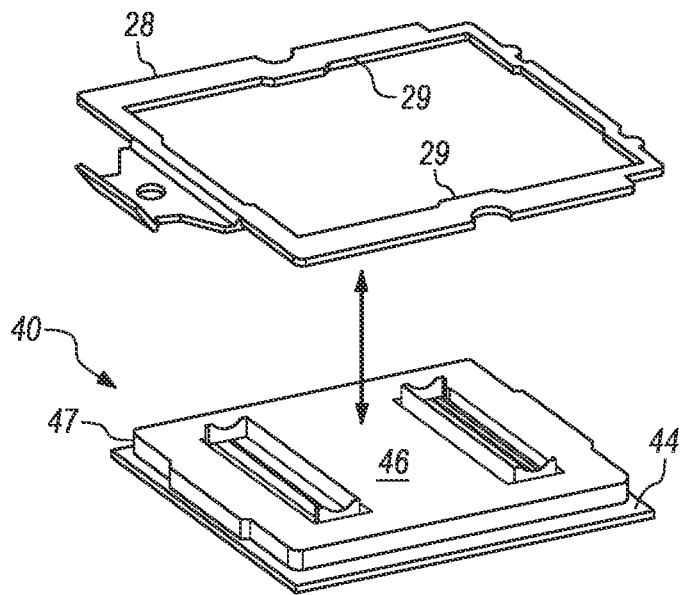
FIG. 7A is a perspective assembly view of the interposer and a carrier frame that may be secured about the interposer.

FIG. 7A is a perspective assembly view of the interposer 40 and a carrier frame 28 that may be secured about the interposer. In particular, the lid 46 forms an outer perimeter structure 47 that engages an inner perimeter edge 29 of the carrier frame 28. The carrier frame is used to facilitate handling of the interposer 40 without contacting the pad array and to facilitate positioning of the interposer 40 into the socket 18.

Figure 7B:
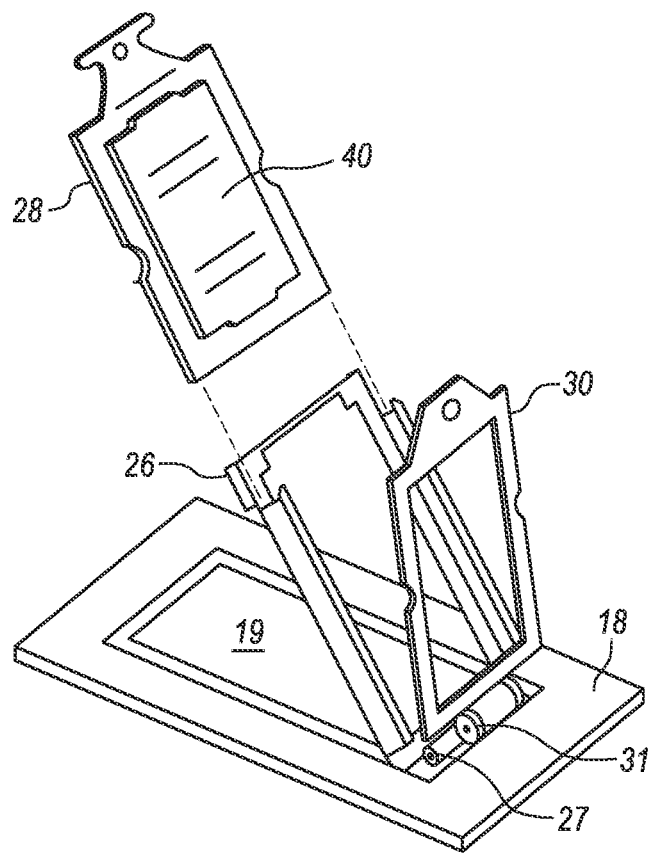
FIG. 7B is a perspective view of the interposer and carrier frame assembly being installed in a CPU tray that is hinged to the socket.

FIG. 7B is a perspective view of the interposer 40 and carrier frame 28 being installed in a CPU tray 26 that is hinged to the socket 18. After sliding the carrier frame 28 into the CPU tray 26, the CPU tray 26 may then be closed about a hinge 27 until the pad array of the interposer 40 is aligned above or in contact with the pin array 19. Subsequently, the load frame 30 may be closed about a hinge 31 to apply a load (force) that biases the interposer 40 into the socket 18, such that the pad array of the interposer is firmly pressed against the pin array of the socket. The load frame 30 may be secured in the closed position with a screw as shown in FIG. 5.

Figure 8A:
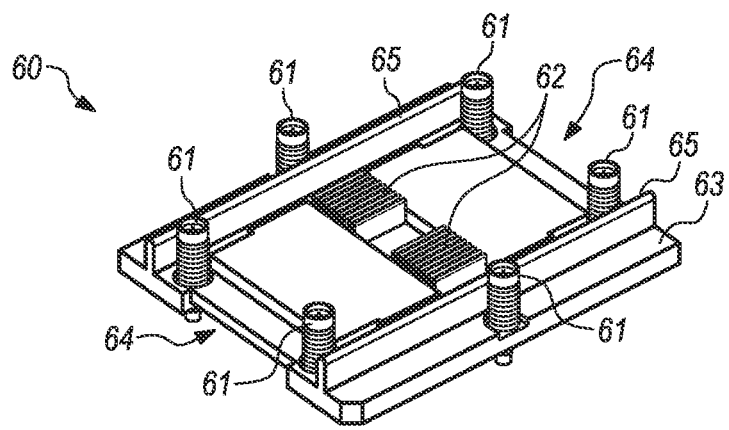
FIG. 8A is a top perspective view of the heatsink assembly.

FIG. 8A is a top perspective view of the heatsink assembly 60 that is secureable to the socket 18 over the interposer. The heatsink assembly 60 includes a thermally conductive body 63, six (6) spring-loaded mounting screws 61, two sets of heatsink fins 62, and opposing passages 64 that allow cables to extend laterally from under the heatsink. The heatsink assembly 60 further includes stiffening ribs 65 on opposing sides of the heatsink body 63.

Figure 8B:
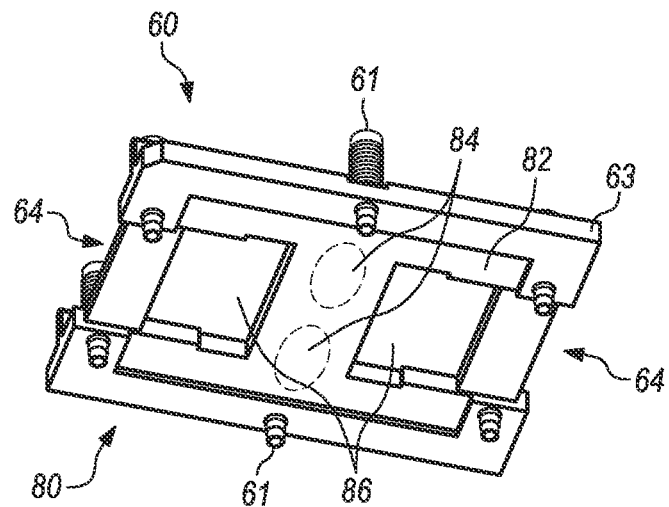
FIG. 8B is a bottom perspective view of the heatsink assembly.
Figure 8C:
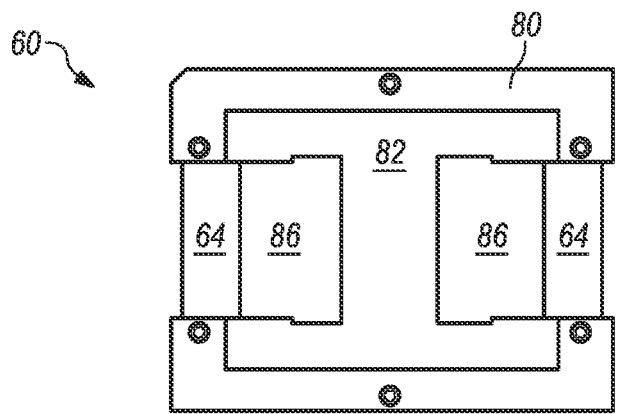
FIG. 8C is a bottom plan view of the heatsink assembly.

FIG. 8B is a bottom perspective view of the heatsink assembly 60. The heatsink body 63 includes a bottom side 80 having several features or areas. A contact area 82 provides a flat surface that contacts the lid or top 46 of the interposer 40 to conduct heat away from the interposer. Specifically, the areas 84 are directly aligned with the retimers 48 (see FIG. 6B) and are directly below the sets of heatsink fins 62. The bottom side 80 also include a pair of recessed areas 86 that accommodate cable connectors. The recessed areas 86 are adjacent the passages 64, such that the cables 22 (see FIG. 5) are able to extend from the recessed areas 86 and through the passages 64. FIG. 8C is a bottom plan view of the heatsink assembly 60 that illustrates the contact area 82, the recesses 86 and the passages 64.

Figure 9A:
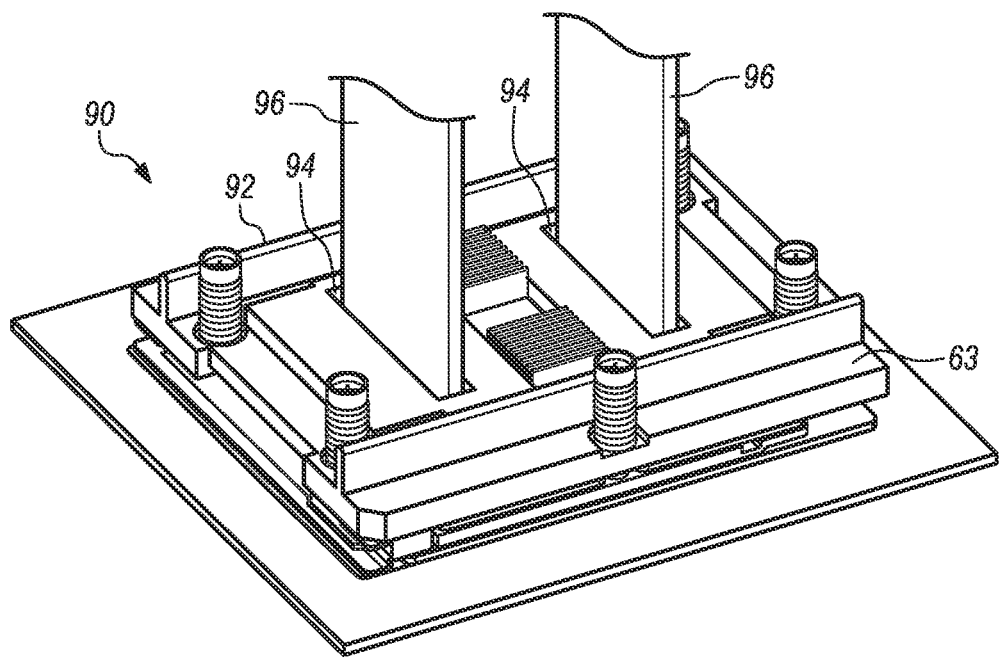
FIG. 9A is a top perspective view of a fully assembled system with the interposer, PCIe cable connectors, and heatsink assembly connected to the socket according to an alternative embodiment.

FIG. 9A is a top perspective view of a fully assembled system 90 with the interposer, PCIe cable connectors, and heatsink assembly connected to the socket according to an alternative embodiment. The system 90 is similar to the system 50 of FIG. 4, except that the heatsink has been modified to allow the use of straight cables that extend through the body 63 of the heatsink rather than between the heatsink and the interposer. Accordingly, the passage 64 of FIG. 4 is no longer needed. Rather, the heatsink assembly 92 includes first and second openings 94 that extend from the bottom surface to the top surface so that the cables 96 that extend from the interposer through the heatsink body 63. Otherwise, the heatsink 92 may be made and used similar to the heatsink 50 of FIGS. 4 and 5.

Figure 9B:
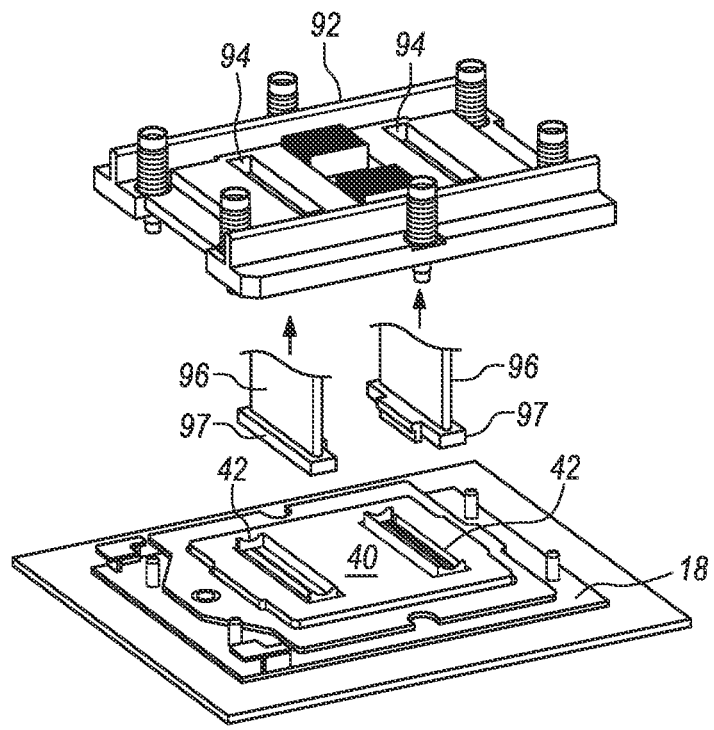
FIG. 9B is a perspective assembly view of a pair of PCIe cable connectors that may be connected to the interposer and a heatsink assembly that may be secured to the socket without interfering with the cable connectors according to the alternative embodiments of FIG. 9A.

FIG. 9B is a perspective assembly view of a pair of cable connectors 97 that may be connected to the connectors 42 of the interposer 40 and the heatsink 92 that may be secured to the socket 18 without interfering with the cable connectors 97 or cables 96 according to the alternative embodiment of FIG. 9A.

As will be appreciated by one skilled in the art, embodiments may take the form of a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device. Furthermore, any program instruction or code that is embodied on such computer readable storage media (including forms referred to as volatile memory) that is not a transitory signal are, for the avoidance of doubt, considered "non-transitory".

Program code embodied on a computer readable storage medium may be transmitted using any appropriate medium, including but not limited to wireless, wireline, optical fiber cable, RF, etc., or any suitable combination of the foregoing. Computer program code for carrying out various operations may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments may be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored on computer readable storage media is not a transitory signal, such that the program instructions can direct a computer, other programmable data processing apparatus, or other devices to function in a particular manner, and such that the program instructions stored in the computer readable storage medium produce an article of manufacture.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:
1. An apparatus, comprising:
   an interposer including:
      a planar substrate having a bottom side and a top side;
      a pad array formed on the bottom side of the planar substrate, wherein the pad array is configured to connect with a pin array within a first CPU socket;
      a first serial computer expansion bus connector formed on the top side of the planar substrate and electronically coupled to a first portion of the pad array;
      a second serial computer expansion bus connector formed on the top side of the planar substrate and electronically coupled to a second portion of the pad array; and a perimeter structure secured to the planar substrate and adapted for securing to a CPU carrier; and a heatsink securable to the first CPU socket, wherein the heatsink includes a bottom surface having a contact area for contacting the interposer, wherein the contact area applies a load to the interposer and conducts heat away from the interposer, and wherein the heatsink includes a first passage for the first serial computer expansion bus cable to extend away from the first serial computer expansion bus connector on the interposer and a second passage for the second serial computer expansion bus cable to extend away from the second serial computer expansion bus connector on the interposer.

2. The apparatus of claim 1, characterized in that the interposer has a form factor allowing for substitution of the interposer for a CPU adapted for the first CPU socket.

3. The apparatus of claim 1, wherein a respective serial computer expansion bus of each of the first and second serial computer expansion bus connectors is designed according to a Peripheral Component Interconnect Express standard.

4. The apparatus of claim 1, further comprising:
a first retimer electronically coupled between the first portion of the pad array and the first serial computer expansion bus connector; and
a second retimer electronically coupled between the second portion of the pad array and the second serial computer expansion bus connector, wherein the first and second retimers are disposed on the top side of the planar substrate and between the first and second serial computer expansion bus connectors.

5. The apparatus of claim 1, wherein the perimeter structure includes a lid, and wherein the CPU carrier is secured to the perimeter structure.

6. A kit, comprising:
an interposer including:
a planar substrate having a bottom side and a top side;
a pad array formed on the bottom side of the planar substrate, wherein the pad array is configured to connect with a pin array within a first CPU socket;
a first serial computer expansion bus connector formed on the top side of the planar substrate and electronically coupled to a first portion of the pad array;
a second serial computer expansion bus connector formed on the top side of the planar substrate and electronically coupled to a second portion of the pad array; and
a perimeter structure secured to the planar substrate and adapted for securing to a CPU carrier; and
a heatsink securable to the first CPU socket, wherein the heatsink includes a bottom surface having a contact area for contacting the interposer, wherein the contact area applies a load to the interposer and conducts heat away from the interposer, and wherein the heatsink includes a first passage for the first serial computer expansion bus cable to extend away from the first serial computer expansion bus connector on the interposer and a second passage for the second serial computer expansion bus cable to extend away from the second serial computer expansion bus connector on the interposer.

7. The kit of claim 6, wherein the interposer includes a first retimer and a second retimer, the first retimer electronically coupled between the first portion of the pad array and the first serial computer expansion bus connector, and the second retimer electronically coupled between the second portion of the pad array and the second serial computer expansion bus connector, wherein the first and second retimers are disposed on the top side of the planar substrate and between the first and second serial computer expansion bus connectors, and wherein the heatsink includes a set of heatsink fins disposed on a top surface of the heatsink for alignment with the first and second retimers.

8. The kit of claim 7, wherein the heatsink includes stiffening ribs disposed on the top surface and extending along opposing sides of the top surface.

9. The kit of claim 7, further comprising:
a first serial computer expansion bus cable having a first cable connector for connecting to the first serial computer expansion bus connector on the interposer; and
a second serial computer expansion bus cable having a second cable connector for connecting to the second serial computer expansion bus connector on the interposer.

10. The kit of claim 6, wherein the first passage extends laterally along the bottom surface of the heatsink to a first edge of the heatsink and the second passage extends laterally along the bottom surface of the heatsink to a second edge of the heatsink that is opposite of the first edge.

11. The kit of claim 6, wherein the first passage extends through the heatsink from the bottom surface to the top surface of the heatsink for alignment with the first serial computer expansion bus connector on the interposer and the second passage extends through the heatsink from the bottom surface to the top surface of the heatsink for alignment with the second serial computer expansion bus connector on the interposer.

12. An apparatus, comprising:
a printed circuit board assembly including the first CPU socket and a second CPU socket, wherein the first and second CPU sockets are connected by a CPU interconnect;
an interposer installed in the first CPU socket, wherein the interposer includes: a planar substrate having a bottom side and a top side; a pad array formed on the bottom side of the planar substrate, wherein the pad array is configured to connect with a pin array within a first CPU socket; a first serial computer expansion bus connector formed on the top side of the planar substrate and electronically coupled to a first portion of the pad array; a second serial computer expansion bus connector formed on the top side of the planar substrate and electronically coupled to a second portion of the pad array; and a perimeter structure secured to the planar substrate and adapted for securing to a CPU carrier;
a CPU installed in the second CPU socket;
a first serial computer expansion bus cable having a first cable connector coupled to the first serial computer expansion bus connector on the interposer;
a second serial computer expansion bus cable having a second cable connector coupled to the second serial computer expansion bus connector on the interposer; and
a heatsink secured to the first CPU socket, wherein the heatsink includes a bottom surface having a contact area in contact with the interposer, wherein the contact area applies a load to the interposer and conducts heat away from the interposer, and wherein the heatsink includes a first passage for the first serial computer expansion bus cable to extend away from the first serial computer expansion bus connector on the interposer and a second passage for the second serial computer expansion bus cable to extend away from the second serial computer expansion bus connector on the interposer.

13. The apparatus of claim 12, characterized in that the interposer has a form factor allowing for substitution of the interposer for a second CPU adapted for the first CPU socket.

14. The apparatus of claim 12, further comprising:

a graphics processing unit connected to the first serial computer expansion bus cable.

15. The apparatus of claim 14, further comprising:
a component selected from a network adapter or a nonvolatile memory device, wherein the component is connected to the second serial computer expansion bus cable.

16. The apparatus of claim 12, further comprising:
a first retimer electronically coupled between the first portion of the pad array and the first serial computer expansion bus connector; and
a second retimer electronically coupled between the second portion of the pad array and the second serial computer expansion bus connector, wherein the first and second retimers are disposed on the top side of the planar substrate between the first and second serial computer expansion bus connectors.

17. The apparatus of claim 1, wherein the first passage extends laterally along the bottom surface of the heatsink to a first edge of the heatsink and the second passage extends laterally along the bottom surface of the heatsink to a second edge of the heatsink that is opposite of the first edge.

18. The apparatus of claim 1, wherein the first passage extends through the heatsink from the bottom surface to the top surface of the heatsink for alignment with the first serial computer expansion bus connector on the interposer and the second passage extends through the heatsink from the bottom surface to the top surface of the heatsink for alignment with the second serial computer expansion bus connector on the interposer.

19. The apparatus of claim 12, wherein the first passage extends laterally along the bottom surface of the heatsink to a first edge of the heatsink and the second passage extends laterally along the bottom surface of the heatsink to a second edge of the heatsink that is opposite of the first edge.

20. The apparatus of claim 12, wherein the first passage extends through the heatsink from the bottom surface to the top surface of the heatsink for alignment with the first serial computer expansion bus connector on the interposer and the second passage extends through the heatsink from the bottom surface to the top surface of the heatsink for alignment with the second serial computer expansion bus connector on the interposer.

* * * * *